United States Patent [19]
Mifune

[11] Patent Number: 5,409,540
[45] Date of Patent: Apr. 25, 1995

[54] CHEMICAL VAPOR PHASE GROWTH METHOD AND CHEMICAL VAPOR PHASE GROWTH APPARATUS

[75] Inventor: Akito Mifune, Kawasaki, Japan
[73] Assignee: Fujitsu Limited, Kawasaki, Japan
[21] Appl. No.: 181,249
[22] Filed: Jan. 13, 1994

Related U.S. Application Data

[62] Division of Ser. No. 972,390, Nov. 6, 1992, Pat. No. 5,298,278.

[30] Foreign Application Priority Data

Nov. 12, 1991 [JP] Japan .................. 3-295587

[51] Int. Cl.$^6$ .............................. C23C 16/00
[52] U.S. Cl. ...................... 118/719; 118/715; 118/725
[58] Field of Search ............. 118/715, 719, 725

[56] References Cited

U.S. PATENT DOCUMENTS

| | | | |
|---|---|---|---|
| 4,817,557 | 4/1989 | Diem | 118/719 |
| 4,957,777 | 9/1990 | Ilderem | 437/200 |
| 4,966,519 | 10/1990 | Davis | 118/719 |
| 4,985,372 | 1/1991 | Narita | 437/200 |
| 5,180,432 | 1/1993 | Hansen | 118/715 |

*Primary Examiner*—Richard Bueker
*Attorney, Agent, or Firm*—Nikaido, Marmelstein, Murray & Oram

[57] ABSTRACT

A chemical vapor phase growth method and apparatus therefor for depositing tungsten silicide, using source gases silane ($SiH_4$) and tungsten hexafluoride ($WF_6$). In this apparatus, water vapor at a partial pressure of $10^{-8}$ to $10^{-9}$ order of Torr is supplied in the process of successively depositing tungsten silicide films on semiconductor substrates of plural batches, whereby the sheet resistance of the tungsten silicide films can be made constant through the batches. It is thus possible to solve the problem of a conventional apparatus, i.e., the phenomenon that the sheet resistance of the silicide films increases as the batch number increases. This constant sheet resistance is attained by keeping the thickness of the tungsten silicide films uniform through the process of all batches.

8 Claims, 5 Drawing Sheets

CHEMICAL VAPOR PHASE GROWTH METHOD AND CHEMICAL VAPOR PHASE GROWTH APPARATUS

This is a division of application Ser. No. 07/972,390, filed Nov. 6, 1992, now U.S. Pat. No. 5,298,278.

BACKGROUND OF THE INVENTION

1. Field of the Invention

The present invention relates to a chemical vapor phase growth method and a chemical vapor phase growth apparatus for performing the method.

A silicide of a heat-resistant metal is used as a material which can maintain the wiring of a micropattern required of a high-density semiconductor integrated circuit at low electrical resistance and which can provide stable wiring producing neither resistance increase nor disconnection, which is caused by migration of atoms.

2. Description of the Related Art

A typical example of such a silicide is tungsten silicide, and a thin film thereof is generally formed by a chemical vapor phase growth or so called chemical vapor deposition (CVD) method. For example, a silicon wafer is heated to a temperature of hundreds of centi degrees (°C.) in a chamber which is evacuated to vacuum, and then silane ($SiH_4$) and tungsten hexafluoride ($WF_6$) are introduced into the chamber. As a result, tungsten silicide ($WSi_2$) is deposited on the silicon wafer. The tungsten silicide $WSi_2$ is possibly formed by the following reaction:

$$2SiH_4 + WF_6 \rightarrow WSi_2 + 6HF + H_2$$

The resistance of the tungsten silicide film formed by the above chemical vapor phase growth method varies with batch. As a result of follow-up investigation of the above phenomenon, the inventors obtained the following finding:

1) A chemical vapor phase growth apparatus in which air is introduced for every batch produces small differences in the film resistance between batches.
2) An apparatus in which chemical vapor phase growth is successively performed for a plurality of batches without introducing atmospheric air into the chamber produces an increase in the film resistance with an increase in the batch number, as shown in FIG. 4.
3) In the apparatus 2), the partial pressure of water vapor in the chamber decreases with an increase in the batch number, as shown in FIG. 3.
4) A difference in the film resistance is mainly caused by a difference in the thickness of the tungsten silicide film.

FIGS. 3 and 4 will be described in detail later.

The inventors estimated from the above finding that an increase in the resistance of a tungsten silicide film is due to a change in the growth speed of the tungsten silicide film, which is caused by a change in the amount of the water vapor remaining in the chamber of the chemical vapor phase growth apparatus used.

SUMMARY OF THE INVENTION

It is an object of the present invention to prevent the occurrence of the phenomenon that the resistance of the tungsten silicide film formed by a chemical vapor phase growth method varies with batch.

It is another object of the present invention to enable the variations in resistance of the tungsten silicide film formed by a chemical vapor phase growth apparatus for mass production to be inhibited by controlling the partial pressure of the water vapor in the chamber of the apparatus which is provided with a load lock connected to the chamber through a gate valve.

The objects of the present invention can be achieved by a chemical vapor phase growth method in which the waver vapor in an atmosphere for chemical vapor phase growth is previously maintained at a predetermined partial pressure, or a chemical vapor phase growth apparatus comprising a vapor supply pipe for supplying water vapor to a chamber for chemical vapor phase growth of tungsten silicide films.

DESCRIPTION OF THE PREFERRED EMBODIMENTS

Figure 1:
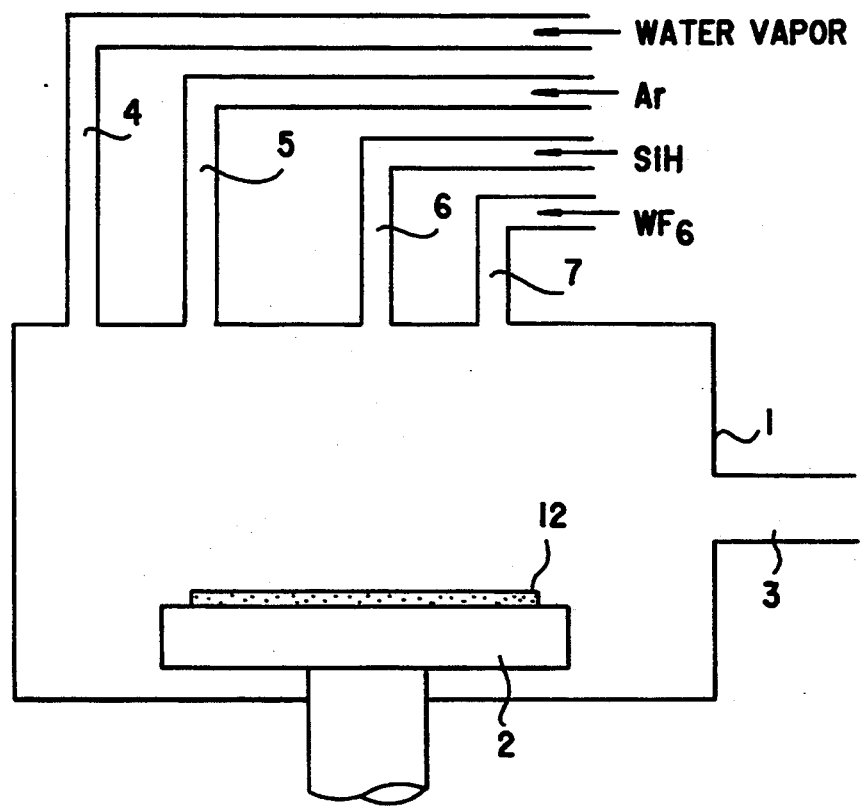
FIG. 1 is a schematic sectional view of a chemical vapor phase growth apparatus for explaining the principle of the present invention.

FIG. 1 is a schematic sectional view of a chemical vapor phase growth apparatus for explaining the principle of the present invention. Unlike a conventional apparatus, in the present invention, a chemical vapor phase growth apparatus for forming tungsten silicide films is provided with a water vapor supply pipe 4, as shown in FIG. 1.

The chemical vapor phase growth apparatus shown in FIG. 1 has a chamber 1 evacuated by a evacuation system (not shown in the drawing) through an exhaust pipe 3, a stage 2 provided in the chamber 1 and gas supply pipes 5, 6 and 7 connected to the chamber 1.

A substrate 12, e.g., a silicon wafer, is mounted on the stage 2 and is heated to a predetermined temperature. A gaseous silicon compound, e.g., silane ($SiH_4$), is introduced from the first source gas supply pipe 6, and a gaseous heat-resistant metal compound, e.g., tungsten hexafluoride ($WF_6$), is introduced from the second source gas supply pipe 7, while the chamber 1 is evacuated. An inert gas, e.g., argon (Ar), is also introduced into the chamber from the inert gas supply pipe 5 so that the inside of the chamber 1 is kept at a predetermined pressure. As a result, a silicide film of a heat-resistant metal such as tungsten silicide ($WSi_2$) is deposited on the surface of the substrate 12.

The above process is the same as a conventional process, however, in the present invention, water vapor is additionally introduced into the chamber 1, for example, through the water vapor supply pipe 4 connected directly to the chamber 1, before or at the same time as introduction of silane and tungsten hexafluoride, from the source gas supply pipes 6 and 7, respectively. This causes the partial pressure of the water vapor in the chamber 1 to be maintained within a predetermined range throughout the process of depositing the silicide film. As a result, variations in the thickness of the silicide film are decreased, thereby solving the problems that the resistance of the silicide film in a later stage of the deposition process is higher than that in an early stage thereof, and the resistance of the silicide film deposited on the substrate 12 increases with an increase in the batch number in the deposition process.

Figure 2:
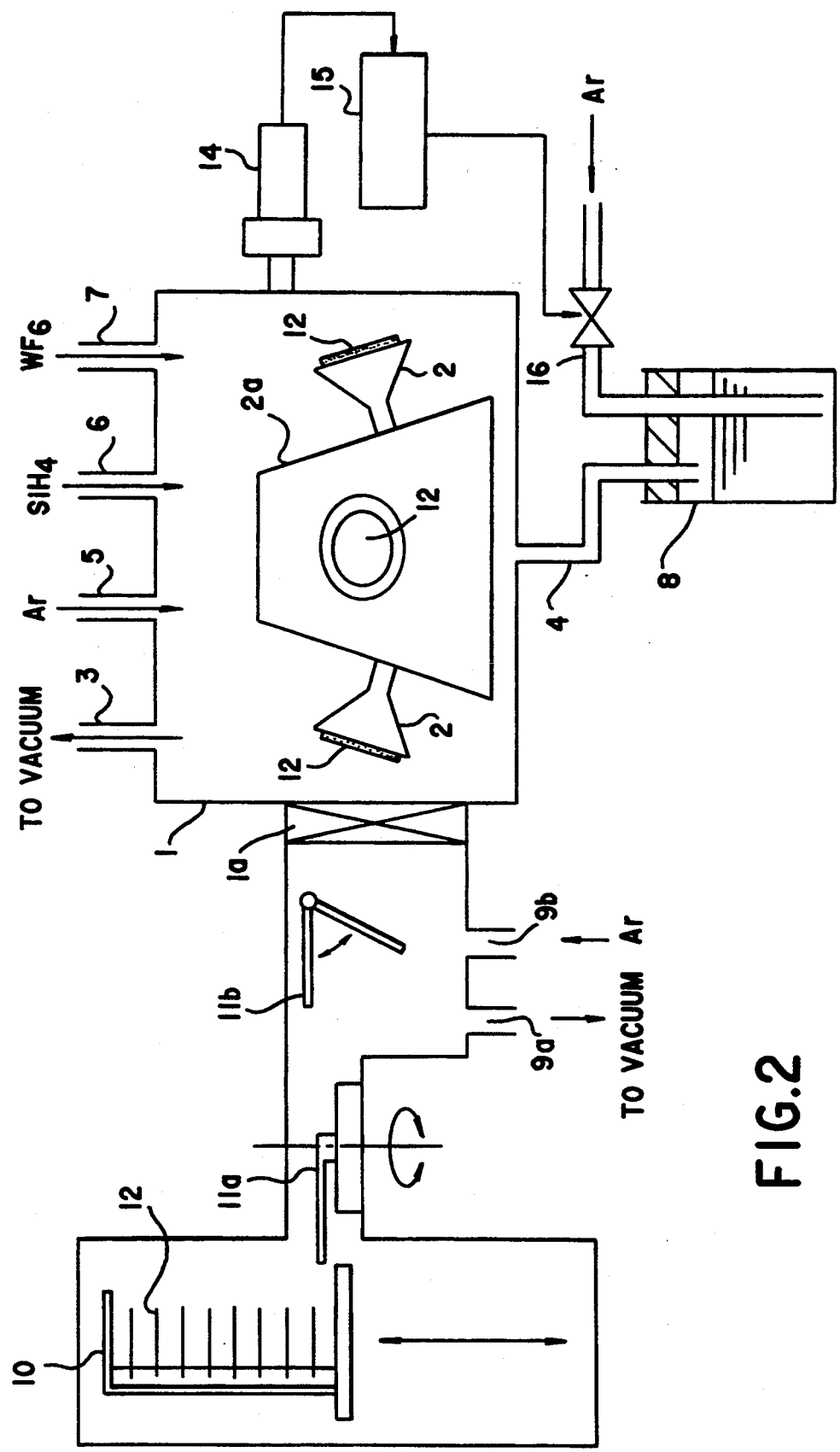
FIG. 2 is a schematic sectional view of the chemical vapor phase growth apparatus used for performing the present invention.

FIG. 2 shows the outline of the structure of the chemical vapor phase growth apparatus used for carrying out the present invention. The apparatus shown in FIG. 2 is different from a conventional apparatus in the point that it is provided with a load lock 9, a water vapor supply pipe 4 and a water vapor source such as a bubbler 8. The operation of the chemical vapor phase growth apparatus shown in FIG. 2 is described below.

For example, a batch of substrates 12 (for example 6 sheets) which are contained in a wafer carrier 10 are successively carried to the load lock 9 by transport mechanisms 11a and 11b and moved into the chamber 1 through the gate valve 1a and then are respectively placed on the stages 2. Each of the stages 2 is fixed to the side of a supporting member 2a, having the form of a truncated cone, for example. A heater (not shown) is attached to each of the stages 2 so as to heat the substrate 12 mounted thereon to a predetermined temperature of 350° C., e.g. The chamber 1 is cooled to 15° C., e.g., by a refrigerant such as water.

The gaseous silicon compound, e.g., silane ($SiH_4$), and the heat-resistant metal compound, e.g., tungsten hexafluoride ($WF_6$), are introduced into the chamber 1 through the source gas supply pipes 6 and 7, respectively, while the chamber 1 is evacuated through the exhaust pipe 3. At the same time, the inert gas, e.g., argon (Ar), is introduced into the chamber 1 through the inert gas supply pipe 5 so as to maintain the inside of the chamber 1 at a predetermined pressure, for example, 0.2 Torr. As a result, a silicide film of a heat-resistant metal such as tungsten silicide ($WSi_2$) is deposited on the surface of each of the substrates 12.

After the silicide film having a predetermined thickness is deposited on the surface of each of the substrates 12 by the above method, the introduction of the source gases through the gas supply pipes 6 and 7 is stopped. The gate valve 1a is opened, and the substrates 12 are successively removed from the stages 2 and contained in the carrier 10 by the transport mechanisms 11a and 11b. New substrates 12 of another batch are taken out of the carrier 10 and are respectively placed on the stages 2, and a silicide film is deposited on each of the substrates 12 in the same as that described above. The deposition of silicide film on all of the substrates 12 contained in the carrier 10 can be performed by repeating the above process according to the number of the batches.

In the present invention, after the substrates 12 of one batch are respectively placed on the stages 2, water vapor is introduced into the chamber 1 through the water vapor supply pipe 4 connected to the chamber 1, for example, before or at the same time as the introduction of silane and tungsten hexafluoride, for example, from the source gas supply pipes 6 and 7, respectively. This causes the partial pressure of the water vapor in the chamber 1 to be maintained within a predetermined range throughout the process of depositing the silicide films. As a result, the variations in the thickness of the silicide film are decreased, thereby solving the problem that the resistance of the silicide film increases with an increase in the batch number in the deposition process.

In another embodiment of the present invention, the partial pressure of the water vapor introduced as described above is measured by a mass spectrometer 14 such as a quadrapole mass filter, which is connected to the chamber 1. The measured value is input to a controller 15. The controller 15 controls a flow control valve 16 connected to the bubbler 8, for example, so that the partial pressure of the water vapor in the chamber 1 is maintained within the predetermined range.

In a further embodiment of the present invention, the water vapor supply pipe 4 shown in FIG. 2 is connected to the load lock 9 in place of the connection to the chamber 1. As shown in the drawing, an exhaust pipe 9a and an inert gas supply pipe 9b are connected to the load lock 9. Namely, the load lock 9 is evacuated by, for example, a rotary pump (not shown), connected to the exhaust pipe 9a, and, an inert gas such as argon is introduced into the load lock 9 from the inert gas supply pipe 9b when the pressure in the load lock 9 must be returned to the atmospheric pressure in order to change the carrier 10.

In this embodiment, water vapor is supplied to the load lock 9 from a water vapor supply pipe (not shown) connected to the load lock 9 at the same time as the gate valve 1a is opened, for changing the batch of the substrates 12. As a result, water vapor is introduced into the chamber 1 through the gate valve 1a. The partial pressure of the water vapor in the chamber 1 is measured by the mass spectrometer 14, and is controlled within a predetermined range by the controller 15 and the flow control valve 16. In this way, water vapor is supplied to the chamber 1 each time the batch of the substrates 12 is changed, thereby solving the problem of a conventional apparatus that the partial pressure of water vapor in a later stage of the process is lower.

Changes in the partial pressure of water vapor and changes in the resistance of the silicide films with batch when tungsten silicide films are respectively deposited on the substrates 12 of 8 batches by the chemical vapor phase growth apparatus shown in FIG. 2 in which water vapor is not introduced into the chamber 1, and the same changes when the tungsten silicide films are deposited by the same apparatus in which water vapor is introduced into the chamber 1 are described below with reference to FIGS. 3 to 6.

Figure 3:
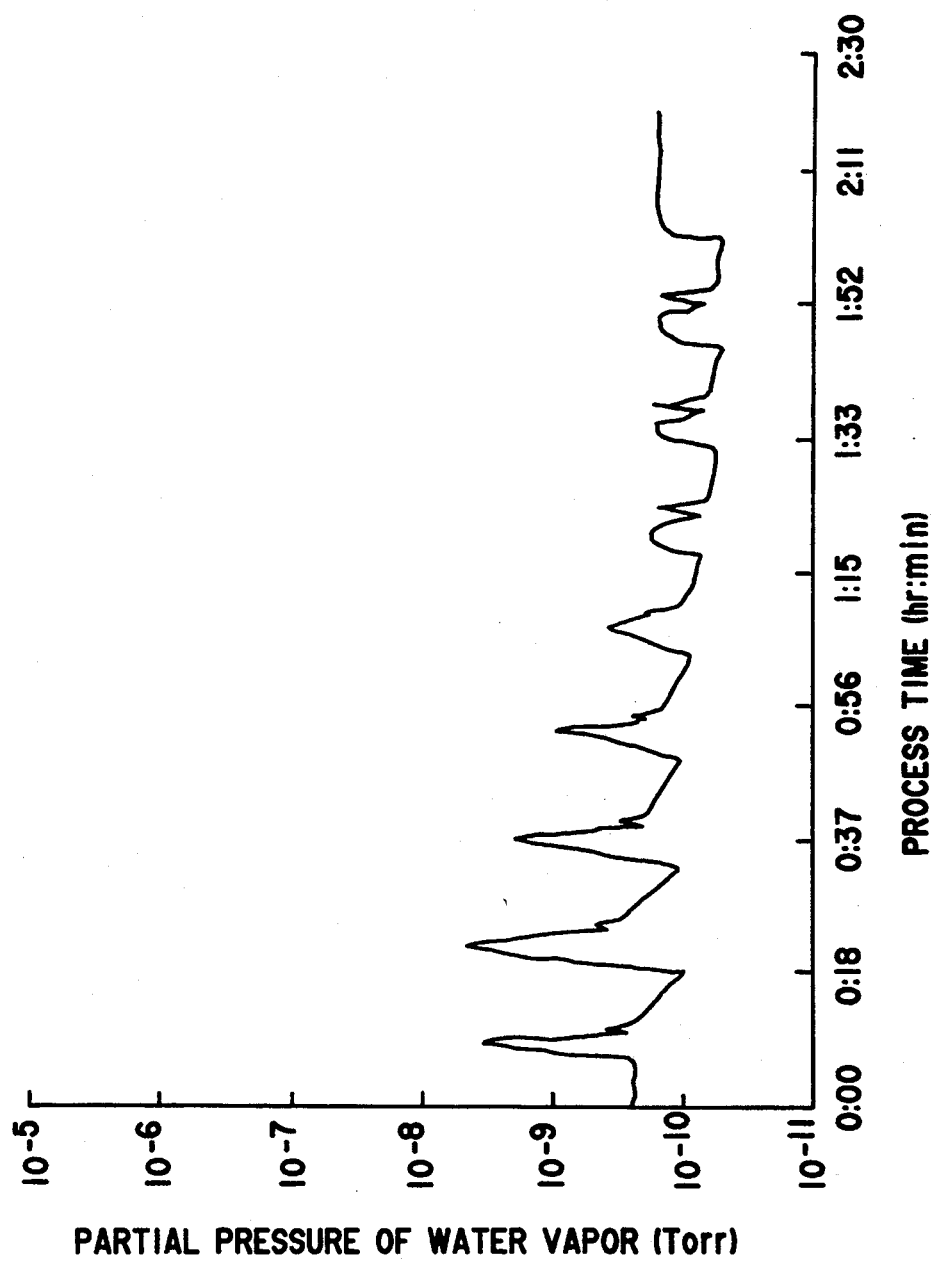
FIG. 3 is a graph showing changes in the partial pressure of water vapor in a chemical vapor phase growth apparatus when a conventional method is used.

FIG. 3 shows changes in the partial pressure of water vapor in the chamber 1 when tungsten silicide films are successively deposited on the substrates 12 of 8 batches by a conventional method, i.e., by the chemical vapor phase growth apparatus shown in FIG. 2 in which water vapor is not supplied. In FIG. 3, time (hr:min) is shown on the abscissa, and the partial pressure (Torr) of water vapor is shown on the ordinate. A peak of the partial pressure appears with a period of about 15 minutes in synchronism with the opening and closing of the gate valve 1a for changing the substrates 12 for each batch.

The changes in the partial pressure are described in detail below. When the gate valve 1a is opened, residual gas flows into the chamber 1 from the load clock 9. The partial pressure of water vapor which is a main component of the residual gas in a usual vacuum apparatus is thus abruptly increased. When the gate valve 1a is closed at the completion of change of the substrates 12, the partial pressure of water vapor is abruptly decreased and then gradually decreased. The slow decrease in the partial pressure is generally caused by the desorption of the water vapor adsorbed on the surface of the chamber 1 which is cooled.

After the gate valve 1a is closed, silane ($SiH_4$) and tungsten hexafluoride ($WF_6$) are introduced into the chamber 1 through the source gas supply pipes 6 and 7, respectively, for about 5 minutes. A tungsten silicide ($WSi_2$) film having a thickness of about 2000Å is consequently grown on the surface of each of the substrates 12.

The peak of the partial pressure of water vapor becomes low and indistinct as the gate valve 1a is repeatedly opened and closed, as shown in FIG. 3. This is caused by the phenomenon that the amount of water vapor remaining in the load lock 9 decreases each time the gate valve 1a is opened.

Figure 4:
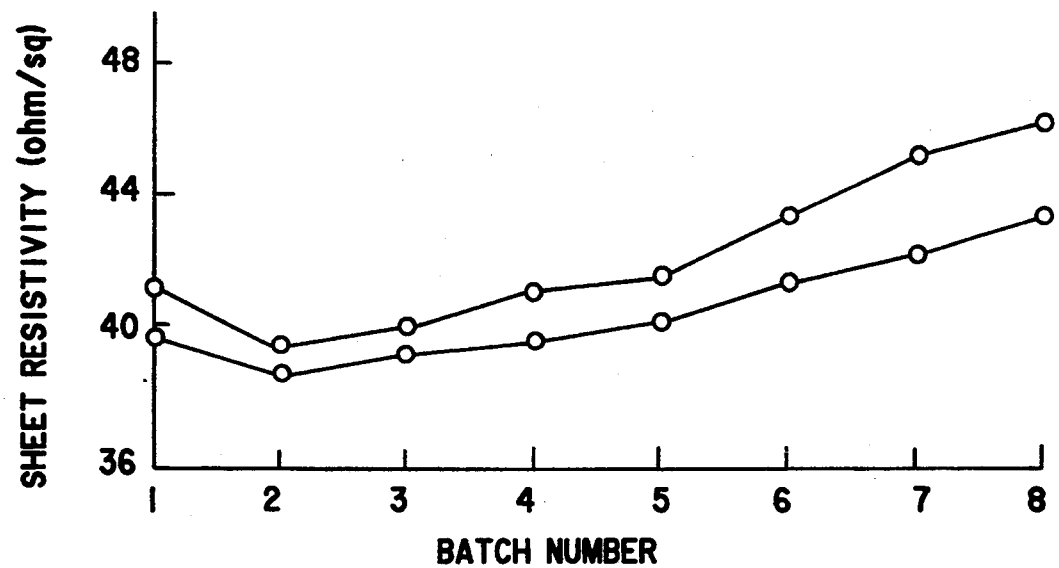
FIG. 4 is a graph showing variations in the sheet resistance of the tungsten silicide films deposited by the conventional method with batch.

FIG. 4 is a graph showing the variations in the sheet resistance with batch when the tungsten silicide films are deposited by a conventional method, i.e., the chemical vapor phase growth apparatus shown in FIG. 2 to which water vapor is not supplied. In FIG. 4, the batch number, i.e., the number of times of opening and closing of the gate valve 1a, is shown on the abscissa, and the sheet resistance ($\Omega$/sq) is shown on the ordinate. In FIG. 4, the maximum and minimum values of the sheet resistance of each batch are plotted. As shown in the drawing, the sheet resistance increases as the batch number increases. It was found from the measurement of the thickness of the silicide film that the changes in the sheet resistance are caused by changes in the film thickness because the resistivity of the silicide films is substantially constant.

Figure 5:
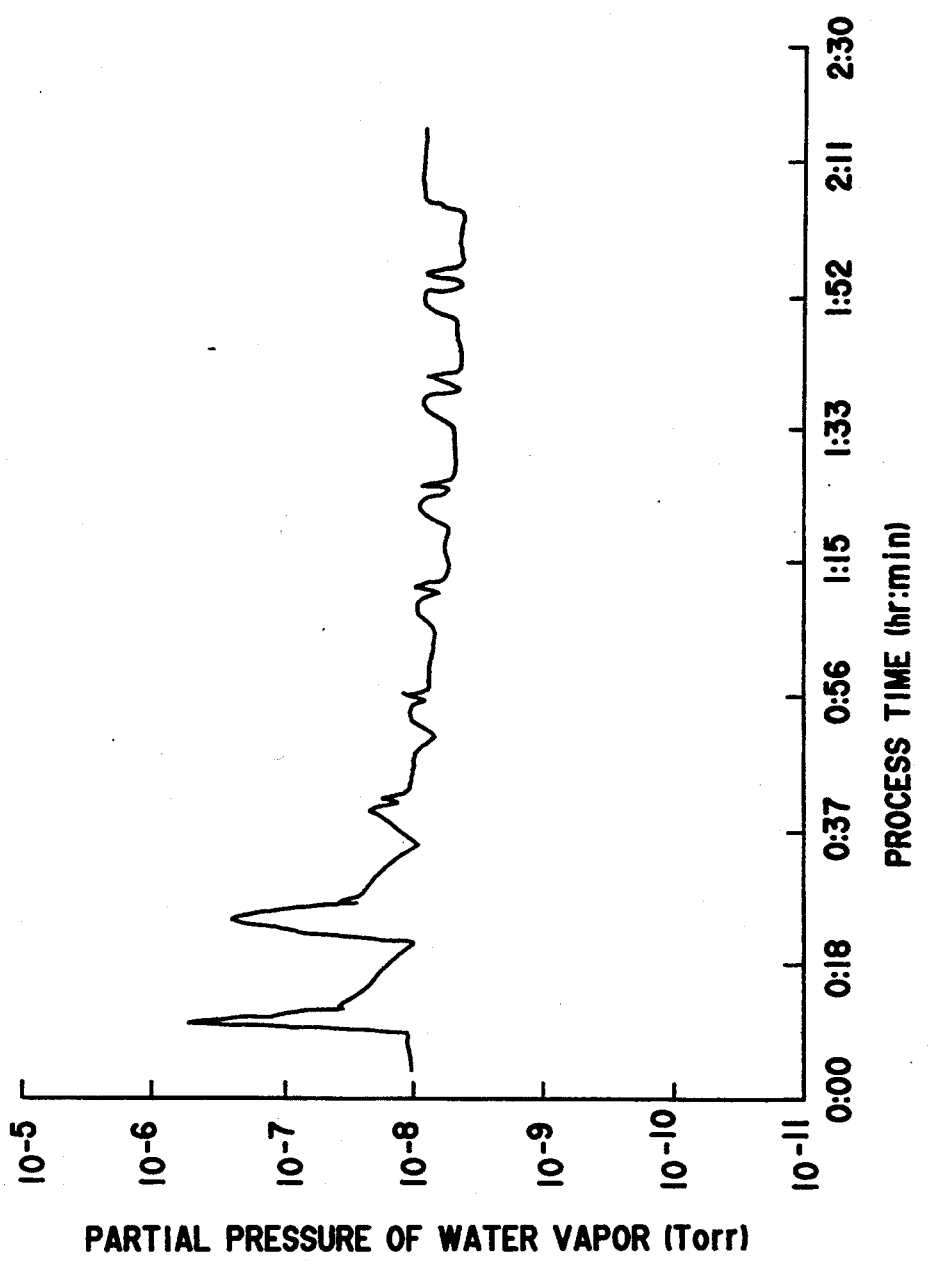
FIG. 5 is a graph showing changes in the partial pressure of water vapor in a chemical vapor phase growth apparatus when a method of the present invention is used.

FIG. 5 shows the changes in the partial pressure of water vapor when tungsten silicide films are deposited by a method of the present invention, i.e., by the chemical vapor phase growth apparatus shown in FIG. 2 to which water vapor is supplied. However, unlike in FIG. 2, water vapor was introduced from the load lock 9, not the water vapor supply pipe 4 connected directly to the chamber 1.

In FIG. 5, when tungsten silicide was successively deposited on the substrates 12 of 8 batches, the partial pressure of water vapor is abruptly increased at the opening of the gate valve 1a, and the partial pressure is abruptly decreased at the closing of the gate valve 1a and is then gradually decreased, like in the case shown in FIG. 3. The peak of the partial pressure of water vapor becomes low and distinct as the gate valve 1a is repeatedly opened and closed. However, in the case shown in FIG. 5, the peak value of the partial pressure of water vapor in the chamber 1 and the stationary value thereof after being decreased are about two orders of magnitude larger than that of the water vapor in the residual gas shown in FIG. 3 because water vapor is introduced from the outside.

Figure 6:
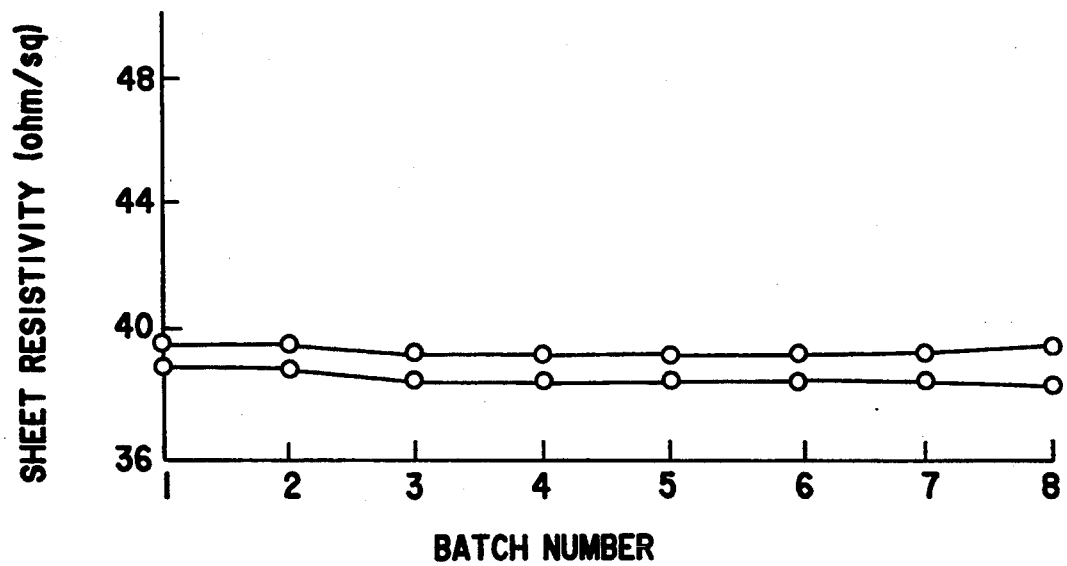
FIG. 6 is a graph showing variations in the sheet resistance of the tungsten silicide films deposited by the method of the present invention with batch.

FIG. 6 shows the relation between the sheet resistance and the batch number when tungsten silicide ($WSi_2$) films were successively deposited on the substrates 12 of 8 batches by chemical vapor phase growth under the conditions shown in FIG. 5. In FIG. 6, the maximum and minimum values of the sheet resistance for each batch are plotted, like in FIG. 4. As shown in drawing, the sheet resistance is constant regardless of the batch number. It was also found that the silicide films deposited have a constant thickness regardless of the batch number.

As described above, when tungsten silicide ($WSi_2$) films are deposited by the chemical vapor phase growth method using as source gases silane ($SiH_4$) and tungsten hexafluoride ($WF_6$), variations in the film thickness and the sheet resistance can be removed by maintaining the partial pressure of water vapor high in the growth atmosphere. It was found that the partial pressure of water vapor effective for removing the variations is $10^{-8}$ to $10^{-9}$ order of Torr, and that a partial pressure of $10^{-10}$ order of Torr is of no effect. Water vapor may be continuously supplied during the period of growth of the tungsten silicide films, or immediately before the growth period of tungsten silicide, particularly, immediately before the chemical vapor phase growth cycle for the substrates of a first batch, as in the above embodiments.

In the present invention, the effects of introduction of water vapor are substantially not affected by the base on which tungsten silicide is deposited. Namely, the silicide film deposited on an insulating layer, for example, consisting of $SiO_2$ or $Si_3N_4$, and the silicide film deposited on the surface of a silicon substrate, which is exposed in the contact holes provided in the insulating layer, have substantially the same thickness and sheet resistance. In addition, although, in the above embodiments, silane ($SiH_4$) is used as a gaseous silicon compound, another compound such as disilane ($Si_2H_6$) or the like may be used. Although the tungsten silicide film is described above as an example, the present invention can be applied to the chemical vapor phase growth of silicides of other heat-resistant metals such as molybdenum (Mo), titanium (Ti) and the like.

I claim:

1. In a chemical vapor phase growth apparatus for chemical vapor phase growth of a silicide of a heat-resistant metal on a substrate, comprising:
   an evacuatable main chamber;
   means to sequentially supply a multiplicity of batches of substrates, for growing a silicide of a heat resistant metal thereon, to said main chamber;
   in said main chamber, during each successive metal silicide film growing operation, at least one of said substrates for growing said metal silicide films thereon;
   a source of each of a gaseous silicon compound, and a gaseous compound of said heat resistant metal;
   gas supply pipe means operatively connected between said main chamber and said sources of said silicon compound and said gaseous compound of said heat resistant metal;
   means to evacuate said main chamber; and
   means to control the conditions in said main chamber sufficient to induce the formation of a metal silicide films on said substrates;
   the improvement which comprises:
   a source of water vapor;
   a water vapor supply pipe for supplying water vapor from said water vapor source means to said main chamber; and
   means to control and maintain the water vapor partial pressure in said main chamber sufficient to cause the thickness of said metal silicide films on said substrates to be of substantially the same thickness in successive batches.

2. The improved apparatus as claimed in claim 1 further including means to control the presence of ambient air in said main chamber to an extent sufficient to cause the thickness of said films to be substantially the same in successive batches.

3. The improved apparatus as claimed in claim 1 further including means to maintain said partial pressure of water at about $10^{-8}$ to $10^{-9}$ Torr.

4. The improved apparatus as claimed in claim 3 further including means to maintain the total pressure in said main chamber at about 0.2 Torr.

5. The improved apparatus as claimed in claim 1 wherein said source of water vapor is a bubbler.

6. A chemical vapor phase growth apparatus for chemical vapor phase growth of a silicide of a heat-resistant metal, comprising:
   a main chamber;
   in said main chamber, a multiplicity of substrates for growing silicide films thereon;
   a source of each of a gaseous silicon compound, and a gaseous compound of said heat resistant metal;
   source gas supply pipes operatively connecting said sources of said gaseous silicon compound and said gaseous compound of said heat resistant metal to said main chamber;
   bubbler means to generate water vapor; and
   a water vapor supply pipe for supplying water vapor to said main chamber.

7. A chemical vapor phase growth apparatus according to claim 6, further comprising a load lock chamber connected to said container through a gate valve operative to permit successive supply of said substrates, contained in said load lock chamber, to said container; and to discharge said substrates.

8. A chemical vapor phase growth apparatus according to claim 7, wherein said water vapor supply pipe is connected to said load lock chamber so as to introduce water vapor into said load lock chamber and thence into said container through said gate valve.

* * * * *